(12) United States Patent
Ueda et al.

(10) Patent No.: US 12,406,862 B2
(45) Date of Patent: Sep. 2, 2025

(54) VACUUM PROCESSING APPARATUS AND OXIDIZING GAS REMOVAL METHOD

(71) Applicant: Tokyo Electron Limited, Tokyo (JP)

(72) Inventors: Hirokazu Ueda, Yamanashi (JP); Yoji Iizuka, Tokyo (JP); Mitsuaki Iwashita, Yamanashi (JP); Antonio Rotondaro, Austin, TX (US); Dipak Aryal, Austin, TX (US); Takeo Nakano, Yamanashi (JP); Ryuichi Asako, Yamanashi (JP); Kenji Sekiguchi, Yamanashi (JP); Koji Akiyama, Yamanashi (JP); Naoki Umeshita, Tokyo (JP); Takashi Hayakawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/499,667

(22) Filed: Nov. 1, 2023

(65) Prior Publication Data
US 2024/0087916 A1 Mar. 14, 2024

Related U.S. Application Data

(62) Division of application No. 17/350,125, filed on Jun. 17, 2021, now abandoned.

(51) Int. Cl.
| | |
|---|---|
| *H01L 21/67* | (2006.01) |
| *C23C 16/26* | (2006.01) |
| *C23C 16/44* | (2006.01) |
| *C23C 16/455* | (2006.01) |
| *C23C 16/50* | (2006.01) |

(52) U.S. Cl.
CPC ........ *H01L 21/67051* (2013.01); *C23C 16/26* (2013.01); *C23C 16/4412* (2013.01); *C23C 16/45587* (2013.01); *C23C 16/50* (2013.01); *H01L 21/6704* (2013.01)

(58) Field of Classification Search
CPC ................................. H01L 21/67051
See application file for complete search history.

(56) References Cited

U.S. PATENT DOCUMENTS

| | | | |
|---|---|---|---|
| 4,016,657 A | 4/1977 | Passey | |
| 2004/0173153 A1 | 9/2004 | Muramatsu et al. | |
| 2004/0250755 A1 | 12/2004 | Ivanov et al. | |
| 2007/0231485 A1* | 10/2007 | Moffat | C23C 16/4409 118/733 |
| 2008/0250933 A1 | 10/2008 | Yun | |

(Continued)

FOREIGN PATENT DOCUMENTS

| | | |
|---|---|---|
| JP | 2017-066506 | 4/2017 |
| JP | 2019-055887 | 4/2019 |

(Continued)

*Primary Examiner* — Keath T Chen
(74) *Attorney, Agent, or Firm* — IPUSA, PLLC

(57) ABSTRACT

A vacuum processing apparatus includes a decompressable process container; a supply port configured to supply, to the process container, an ionic liquid that absorbs an oxidizing gas; and a discharge port configured to discharge the ionic liquid supplied to the process container. A recess is provided at a joint portion between members constituting the process container. The supply port is configured to supply the ionic liquid to the recess, and the discharge port is configured to discharge the ionic liquid supplied to the recess.

3 Claims, 5 Drawing Sheets

(56) References Cited

U.S. PATENT DOCUMENTS

| | | | |
|---|---|---|---|
| 2009/0239338 A1* | 9/2009 | Zhou | H01L 24/11 977/773 |
| 2009/0289213 A1* | 11/2009 | Pipper | C07K 1/22 252/62.51 R |
| 2011/0189406 A1 | 8/2011 | Cho et al. | |
| 2011/0240601 A1* | 10/2011 | Hashizume | H01L 21/67051 156/345.23 |
| 2014/0101964 A1 | 4/2014 | Sirard et al. | |
| 2014/0246364 A1* | 9/2014 | Hruska | C02F 1/78 204/554 |
| 2014/0357092 A1 | 12/2014 | Singh | |
| 2015/0233588 A1 | 8/2015 | Betts et al. | |
| 2020/0011323 A1 | 1/2020 | Furuta et al. | |
| 2020/0152432 A1 | 5/2020 | Kon | |
| 2020/0223152 A1* | 7/2020 | von Fragstein | B29C 66/74283 |
| 2023/0040722 A1 | 2/2023 | Stowell et al. | |

FOREIGN PATENT DOCUMENTS

| | | |
|---|---|---|
| JP | 2021-179009 | 11/2021 |
| KR | 10-2016-0041006 | 4/2016 |

\* cited by examiner

VACUUM PROCESSING APPARATUS AND OXIDIZING GAS REMOVAL METHOD

CROSS-REFERENCE TO RELATED APPLICATIONS

This application is a divisional of U.S. patent application Ser. No. 17/350,125 filed on Jun. 17, 2021, the entire contents of which are incorporated herein by reference.

BACKGROUND

1. Technical Field

The present disclosure relates to a vacuum processing apparatus and an oxidizing gas removal method.

2. Background Art

A technique is known in which a graphene structure is formed on the surface of a substrate housed in a process container by a remote microwave plasma CVD using a carbon-containing gas as a deposition raw material gas (see, for example, Patent Document 1).

The present disclosure provides a technique that enables the removal of an oxidizing gas remaining in a process container.

PRIOR ART DOCUMENT

Patent Document

[Patent Document 1] Japanese Laid-open Patent Publication No. 2019-55887

SUMMARY OF THE INVENTION

According to one aspect of the present disclosure, a vacuum processing apparatus includes: a decompressable process container; a supply port that is formed on a side wall of the process container and that is configured to supply, to the process container, an ionic liquid that absorbs an oxidizing gas; and a discharge port configured to discharge the ionic liquid supplied to the process container.

According to another aspect of the present disclosure, a vacuum processing apparatus includes a decompressable process container; a supply port configured to supply, to the process container, an ionic liquid that absorbs an oxidizing gas; and a discharge port configured to discharge the ionic liquid supplied to the process container. A recess is provided at a joint portion between members constituting the process container. The supply port is configured to supply the ionic liquid to the recess, and the discharge port is configured to discharge the ionic liquid supplied to the recess.

According to the present disclosure, it is possible to remove an oxidizing gas remaining in a process container.

DESCRIPTION OF THE EMBODIMENTS

Figure 1:
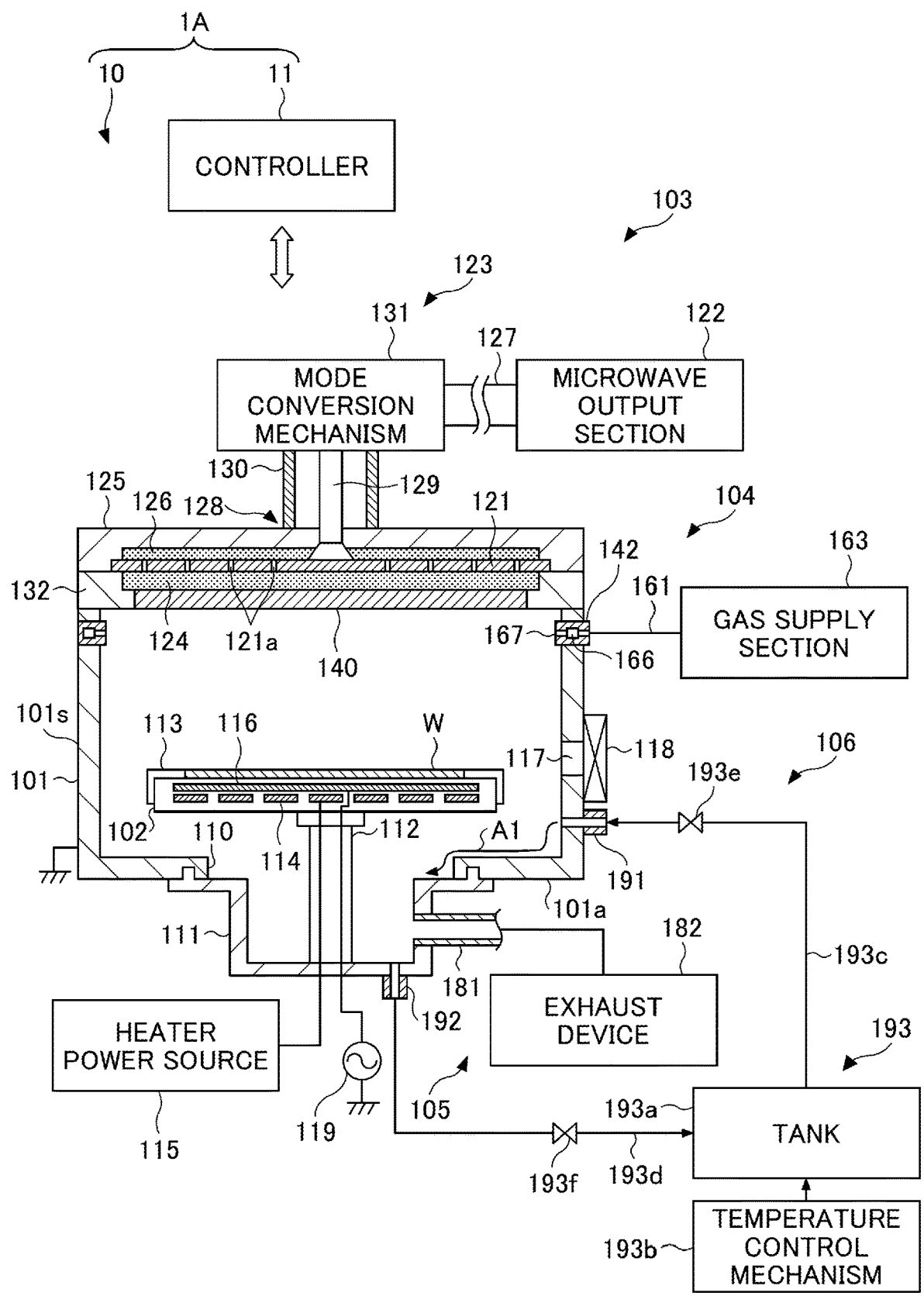
FIG. 1 is a schematic diagram illustrating an example of a vacuum processing apparatus according to a first embodiment.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

[Oxidizing Gas Remaining in Process Container]

In a state in which an oxidizing gas such as $H_2O$ gas or $O_2$ gas is adsorbed on the inner wall of a process container, when a substrate is housed in the process container and a semiconductor process such as deposition or and etching is implemented, the oxidizing gas may be desorbed from the inner wall of the process container and may adversely affect the semiconductor process.

For example, as an example of a semiconductor process, in a case in which a graphene film is formed on the surface of a wiring layer formed on the surface of a substrate, an oxidizing gas desorbed from the inner wall of a process container oxidizes the surface of the wiring layer of the substrate before forming the graphene film, and an oxide film is formed at the interface between the wiring layer and the graphene film. Since the oxide formed at the interface between the wiring layer and the graphene film has insulating properties, the contact resistance between the wiring layer and the graphene film is increased.

Accordingly, the present disclosure provides a technique of supplying an ionic liquid to a process container and causing an oxidizing gas remaining in the process container to be absorbed by the ionic liquid, thereby removing the oxidizing gas remaining in the process container. The details will be described below.

<Vacuum Processing Apparatus>

First Embodiment

Referring to FIG. 1, an example of a vacuum processing apparatus 1A according to a first embodiment will be described. The vacuum processing apparatus 1A illustrated in FIG. 1 may be configured, for example, as a plasma processing apparatus of a RLSA (Radial Line Slot Antenna) microwave plasma system.

The vacuum processing apparatus 1A includes an apparatus body 10 and a controller 11 that controls the apparatus body 10.

The apparatus body 10 includes a chamber 101, a stage 102, a microwave introduction mechanism 103, a gas supply mechanism 104, an exhaust mechanism 105, a liquid supply mechanism 106, and the like.

The chamber 101 is generally cylindrically formed. An opening 110 is formed in the substantially central portion of a bottom wall 101*a* of the chamber 101. The bottom wall 101*a* is provided with an exhaust chamber 111 that is in communication with the opening 110 and that protrudes downward. On a side wall 101*s* of the chamber 101, a transportation port 117 is formed through which the substrate W passes. The transportation port 117 is opened and closed by a gate valve 118. The chamber 101, together with a portion of the microwave introduction mechanism 103, constitutes a process container of which the inside is decompressable.

A substrate W to be processed is mounted on the stage 102. The stage 102 has a generally disk shape. The stage 102 is made of ceramics such as aluminum nitride (AlN). The stage 102 is supported by a support post 112 that has a generally cylindrical shape extending upward from the substantially center of the bottom of the exhaust chamber 111 and is made of ceramics such as AlN. An edge ring 113 is provided at the outer edge of the stage 102 so as to surround the substrate W mounted on the stage 102. Inside the stage 102, a lifting/lowering pin (not illustrated) for lifting and lowering the substrate W is provided to be able to protrude/retract with respect to the upper surface of the stage 102.

Inside the stage 102, a resistance heating type heater 114 is embedded. The heater 114 heats the substrate W mounted on the stage 102 in response to power supplied from a heater power source 115. Also, a thermocouple (not illustrated) is inserted in the stage 102 to control the temperature of the substrate W to, for example, 350° C. to 850° C., based on a signal from the thermocouple. In addition, within the stage 102, an electrode 116 having the same size as the substrate W is embedded above the heater 114. A bias power source 119 is electrically connected to the electrode 116. The bias power source 119 supplies predetermined electric power having a predetermined frequency and magnitude to the electrode 116. This causes ions to be attracted on the substrate W mounted on the stage 102. It should be noted that the bias power source 119 may not be provided depending on the characteristics of a plasma process.

The microwave introduction mechanism 103 is provided on the upper section of the chamber 101. The microwave introduction mechanism 103 includes an antenna 121, a microwave output section 122, a microwave transmission mechanism 123, and the like. The antenna 121 is formed with a number of slots 121a that are through holes. The microwave output section 122 outputs a microwave. The microwave transmission mechanism 123 directs the microwave output from the microwave output section 122 to the antenna 121.

Below the antenna 121, a dielectric window 124 made of a dielectric material is provided. The dielectric window 124 is supported on a support member 132, which is annularly arranged on the upper section of the chamber 101. A target 140 made of metal is arranged on the lower surface (surface facing the stage 102) of the dielectric window 124. The target 140 includes, for example, at least one metal of titanium, cobalt, aluminum, yttrium, aluminum nitride, and titanium nitride. A shielding member 125 and a wave delay plate 126 are provided on the antenna 121. A refrigerant flow path (not illustrated) is provided within the shielding member 125. The shielding member 125 cools the antenna 121, the dielectric window 124, the wave delay plate 126, and the target 140 by a cooling fluid such as water flowing in the refrigerant flow path.

The antenna 121 may be formed, for example, of an aluminum plate or a copper plate having a silver or gold-plated surface. A plurality of slots 121a for emitting a microwave are arranged in the antenna 121 in a predetermined pattern. The arrangement pattern of the slots 121a is suitably set so that the microwave is emitted evenly. An example of a suitable pattern may be radial line slots in which a plurality of pairs of slots 121a including two T-shaped arranged slots 121a as one pair are arranged concentrically. The length and array interval of the slots 121a are suitably set in accordance with the effective wavelength of the microwave ($\lambda$g). The slots 121a may also have other shapes, such as a circular shape or an arc shape. Further, the arrangement configuration of the slots 121a is not particularly limited, and may be an arrangement of helical or radial other than concentric, for example.

The pattern of slots 121a is suitably set to be microwave emission characteristics that enable to obtain a desired plasma density distribution.

The wave delay plate 126 is made of a dielectric material having a dielectric constant greater than vacuum such as quartz, ceramics ($Al_2O_3$), polytetrafluoroethylene, or polyimide. The wave delay plate 126 has a function to make the antenna 121 smaller by shortening the wavelength of the microwave to shorter than in vacuum. It should be noted that the dielectric window 124 is made of a similar dielectric material.

The thickness of the dielectric window 124 and the wave delay plate 126 is adjusted so that an equivalent circuit formed by the wave delay plate 126, the antenna 121, the dielectric windows 124, the target 140, and the plasma satisfy the resonance conditions. By adjusting the thickness of the wave delay plate 126, the phase of the microwave can be adjusted. By adjusting the thickness of the wave delay plate 126 so that the joint portion of the antenna 121 is an anti-node of a standing wave, the reflection of the microwave can be minimized and the emission energy of the microwave can be maximized. In addition, by making the wave delay plate 126 and the dielectric window 124 with the same material, it is possible to prevent interfacial reflection of the microwave.

The microwave output section 122 has a microwave oscillator. The microwave oscillator may be of a magnetron type or of a solid state type. The frequency of the microwave that is generated by the microwave oscillator may be, for example, a frequency of 300 MHz to 10 GHz. As an example, the microwave output section 122 outputs a microwave of 2.45 GHz by a magnetron type microwave oscillator. The microwave is an example of an electromagnetic wave.

The microwave transmission mechanism 123 includes a waveguide 127, a coaxial waveguide 128, a mode conversion mechanism 131, and the like. The waveguide 127 directs a microwave output from the microwave output section 122. The coaxial waveguide 128 includes an inner conductor 129 connected to the center of the antenna 121 and an outer conductor 130. The mode conversion mechanism 131 is provided between the waveguide 127 and the coaxial waveguide 128. The microwave output from the microwave output section 122 propagates in the waveguide 127 in the TE mode and is converted from the TE mode to the TEM mode by the mode conversion mechanism 131. The microwave converted to the TEM mode propagates through the coaxial waveguide 128 to the wave delay plate 126 and is emitted from the wave delay plate 126 into the chamber 101 via the slots 121a of the antenna 121, the dielectric window 124, and the target 140. It should be noted that a tuner (not illustrated) is provided in the middle of the waveguide 127 so that the impedance of the load (plasma) in the chamber 101 matches the output impedance of the microwave output section 122.

The gas supply mechanism 104 includes a shower ring 142. The shower ring 142 is annularly arranged along the inner wall of the chamber 101. The shower ring 142 includes an annular flow path 166 provided therein and a plurality of ejection ports 167 connected to the flow path 166 and opened therein. A gas supply section 163 is connected to the flow path 166 via a pipe 161. The gas supply section 163 includes a plurality of gas sources, a plurality of flow controllers, and the like. The gas supply section 163 is configured to supply at least one process gas from a corresponding gas source via a corresponding flow controller to the shower ring 142. The gas supplied to the shower ring 142 is supplied into the chamber 101 from the plurality of ejection ports 167.

In a case which a metal film is deposited on the substrate W, the gas supply section 163 supplies an inert gas controlled to a predetermined flow rate into the chamber 101 via the shower ring 142. The inert gas may be, for example, a noble gas or a nitrogen ($N_2$) gas. Alternatively, in a case in which a metal film is formed on the substrate W, the gas supply section 163 may supply, in addition to the inert gas, a reducing gas into the chamber 101 via the shower ring 142. The reducing gas may be, for example, a hydrogen-containing gas or a halogen-containing gas.

Also, in a case in which a graphene film is deposited on the substrate W, the gas supply section 163 supplies a carbon-containing gas, a hydrogen-containing gas, and a noble gas controlled to predetermined flow rates into the chamber 101 via the shower ring 142. The carbon-containing gas may be, for example, a $C_2H_2$ gas, a $C_2H_4$ gas, a $CH_4$ gas, a $C_2H_6$ gas, a $C_3H_8$ gas, a $C_3H_6$ gas, or a combination thereof. The hydrogen-containing gas may be, for example, a hydrogen ($H_2$) gas. It should be noted that a halogen-based gas such as a fluorine ($F_2$) gas, a chlorine ($Cl_2$) gas, or a bromine ($Br_2$) gas may be used instead of or in addition to the $H_2$ gas. The noble gas may be, for example, an argon (Ar) gas or a helium (He) gas.

An exhaust mechanism 105 includes an exhaust chamber 111, an exhaust pipe 181, an exhaust device 182, and the like. The exhaust pipe 181 is provided on the side wall of the exhaust chamber 111. The exhaust device 182 is connected to the exhaust pipe 181. The exhaust device 182 includes a vacuum pump, a pressure control valve, and the like.

The liquid supply mechanism 106 supplies an ionic liquid into the chamber 101 and collects the ionic liquid supplied in the chamber 101. The ionic liquid is an ionic liquid that absorbs an oxidizing gas. Details of the ionic liquid that absorbs an oxidizing gas will be described later. The liquid supply mechanism 106 includes a supply port 191, a discharge port 192, a liquid circulating section 193, and the like.

The supply port 191 is formed through the side wall 101s of the chamber 101. The supply port 191 supplies the ionic liquid from the side of the chamber 101 into the chamber 101. The ionic liquid supplied into the chamber 101 flows downward along the inner wall of the chamber 101, as indicated by the arrow A1 in FIG. 1. FIG. 1 illustrates a case where the supply port 191 is formed below the transportation port 117. However, the supply port 191 may be formed above the transportation port 117.

The discharge port 192 is formed so as to penetrate the bottom of the exhaust chamber 111. The discharge port 192 discharges the ionic liquid supplied in the chamber 101 to the outside of the chamber 101. In FIG. 1, a case is illustrated in which the discharge port 192 is formed at the bottom of the exhaust chamber 111. It should be noted that the discharge port 192 may be formed on the side wall of the exhaust chamber 111 or on the bottom wall 101a of the chamber 101. Also, a plurality of discharge ports 192 may be formed.

The liquid circulating section 193 collects the ionic liquid discharged from the discharge port 192 and introduces the collected ionic liquid into the supply port 191 to circulate the ionic liquid. The liquid circulating section 193 includes a tank 193a, a temperature control mechanism 193b, a forward pipe 193c, a return pipe 193d, and the like.

The tank 193a is connected to the discharge port 192 via the return pipe 193d. The tank 193a stores the ionic liquid that is discharged from the discharge port 192.

Temperature control mechanism 193b includes a heater, a temperature sensor (neither illustrated), and the like. The temperature control mechanism 193b controls the temperature of the ionic liquid in the tank 193a by controlling the heater based on the detected value of the temperature sensor.

The forward pipe 193c connects the supply port 191 to the tank 193a. The forward pipe 193c introduces the ionic liquid stored in the tank 193a into the supply port 191. A valve 193e is interposed on the forward pipe 193c. When the valve 193e is opened, the ionic liquid is introduced from within the tank 193a into the supply port 191, and when the valve 193e is closed, the introduction of the ionic liquid from within the tank 193a into the supply port 191 is stopped.

The return pipe 193d connects the discharge port 192 to the tank 193a. The return pipe 193d collects the ionic liquid discharged from the discharge port 192 into the tank 193a. A valve 193f is interposed on the return pipe 193d. When the valve 193f is opened, the ionic liquid is collected from the discharge port 192 into the tank 193a, and when the valve 193f is closed, the collection of the ionic liquid from the discharge port 192 into the tank 193a is stopped.

The controller 11 includes a memory, a processor, an input/output interface, and the like. The memory contains a recipe including a program executed by the processor and the conditions of each process. The processor executes a program read from the memory and controls each section of the apparatus body 10 through the input/output interface based on the recipe stored in the memory.

For example, the controller 11 performs a method of removing oxidizing gas prior to carrying out a semiconductor process in a process container housing a substrate. Specifically, the controller 11 controls to open the valves 193e and 193f prior to the semiconductor process. This causes the ionic liquid to be supplied from the supply port 191 into the chamber 101, and the supplied ionic liquid absorbs the oxidizing gas remaining in the chamber 101. The ionic liquid absorbing the oxidizing gas is discharged out of the chamber 101 through the discharge port 192. It should be noted that the controller 11 may perform the method of removing the oxidizing gas at a different timing from that before performing the semiconductor process.

As described above, the vacuum processing apparatus 1A according to the first embodiment includes the supply port 191 formed on the side wall 101s of the chamber 101 to supply the ionic liquid into the chamber 101 and the discharge port 192 for discharging the ionic liquid supplied in the chamber 101. This allows the ionic liquid to be supplied from the supply port 191 into the chamber 101 to absorb the oxidizing gas remaining in the chamber 101 by the ionic liquid. In addition, the ionic liquid absorbing the oxidizing gas can be discharged from the discharge port 192 to the outside of the chamber 101. As a result, the oxidizing gas remaining in the chamber 101 can be removed.

It should be noted that although a case has been described in the first embodiment in which one supply port 191 is formed, the present disclosure is not limited to this. For example, a plurality of supply ports 191 may be formed. In a case in which a plurality of supply ports 191 are formed, the plurality of supply ports 191 are preferably formed at intervals along the circumferential direction of the side walls

101s of the chamber 101. This enables the ionic liquid to be ejected from the plurality of positions in the circumferential direction of the chamber 101. Therefore, the ionic liquid flows over a wide range of inner wall of the chamber 101, and the surface area of the ionic liquid flowing in the chamber 101 becomes large. As a result, the absorption efficiency of the oxidizing gas remaining in the chamber 101 is increased.

Second Embodiment

Figure 2:
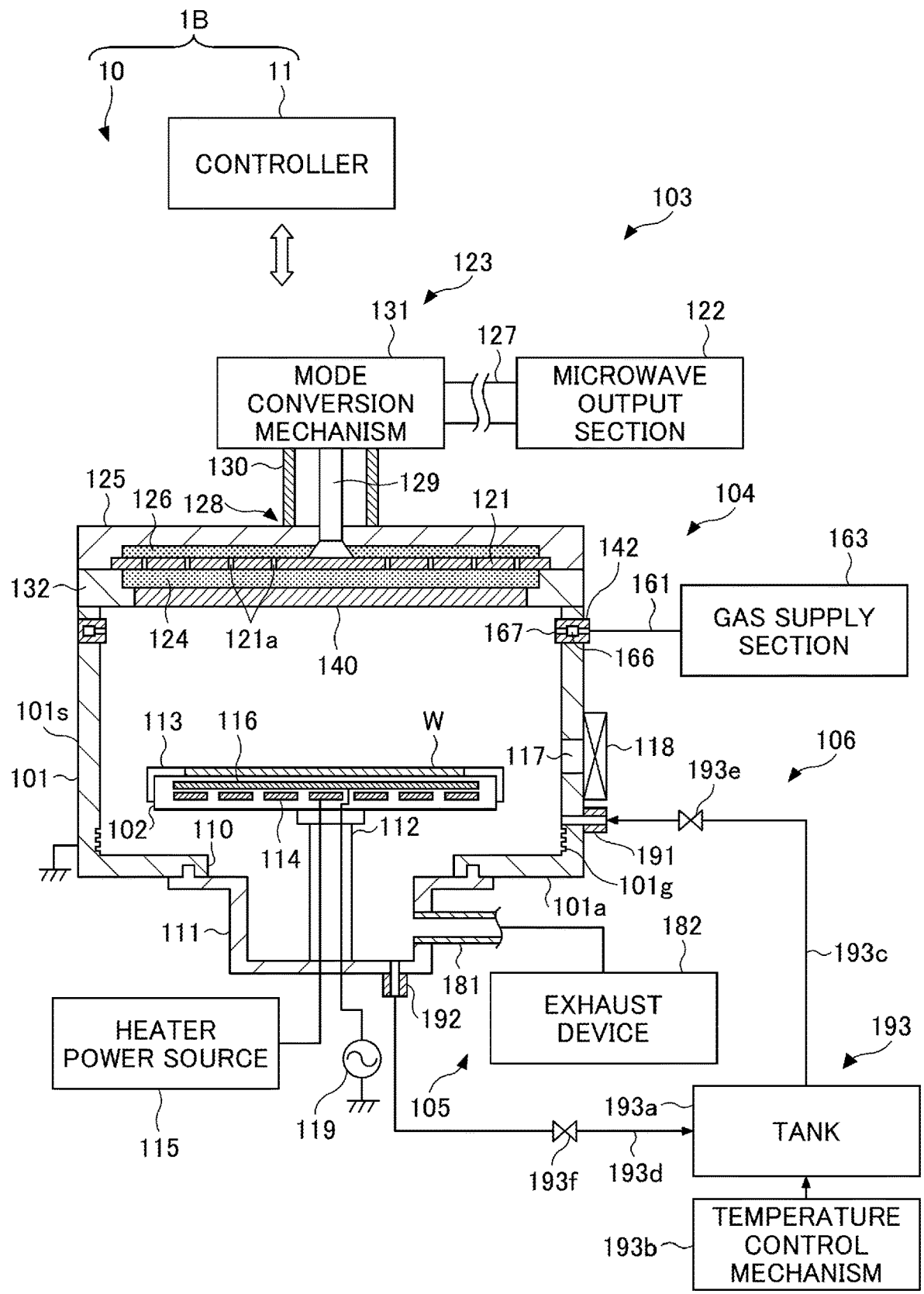
FIG. 2 is a schematic diagram illustrating an example of a vacuum processing apparatus according to a second embodiment.

Referring to FIG. 2, an example of a vacuum processing apparatus 1B according to a second embodiment will be described. The vacuum processing apparatus 1B according to the second embodiment differs from the vacuum processing apparatus 1A according to the first embodiment in that a groove 101g is formed on the inner wall of the chamber 101 to flow the ionic liquid along the circumferential direction of the inner wall. Hereinafter, different points from the vacuum processing apparatus 1A will be mainly described.

The groove 101g is spirally formed along the circumferential direction of the inner wall of the chamber 101. The upper side end of the groove 101g communicates with the supply port 191 to allow the ionic liquid supplied from the supply port 191 to flow along the circumferential direction of the inner wall of the chamber 101. Therefore, because the ionic liquid flows over a wide range of inner wall of the chamber 101, the surface area of the ionic liquid flowing in the chamber 101 becomes large. As a result, the absorption efficiency of the oxidizing gas remaining in the chamber 101 is increased.

As described above, the vacuum processing apparatus 1B according to the second embodiment includes the supply port 191 formed in the side wall 101s of the chamber 101 to supply the ionic liquid into the chamber 101 and the discharge port 192 for discharging the ionic liquid supplied into the chamber 101. This allows the ionic liquid to be supplied from the supply port 191 into the chamber 101 to absorb the oxidizing gas remaining in the chamber 101 by the ionic liquid. In addition, the ionic liquid absorbing the oxidizing gas can be discharged from the discharge port 192 to the outside of the chamber 101. As a result, the oxidizing gas remaining in the chamber 101 can be removed.

Further, according to the vacuum processing apparatus 1B according to the second embodiment, the groove 101g for flowing the ionic liquid along the circumferential direction of the inner wall is formed on the inner wall of the chamber 101. This causes the ionic liquid to flow along the groove 101g within the chamber 101. Therefore, the ionic liquid flows over a wide range of inner wall of the chamber 101, and the surface area of the ionic liquid flowing in the chamber 101 becomes large. Also, because the path from the supply port 191 to the discharge port 192 becomes long, the time for the ionic liquid to flow in the chamber 101 becomes long. As a result, the absorption efficiency of the oxidizing gas remaining in the chamber 101 is increased.

It should be noted that although a case has been described in the second embodiment in which one supply port 191 is formed, the present disclosure is not limited to this. For example, a plurality of supply ports 191 may be formed. In a case in which a plurality of supply ports 191 are formed, it is preferable that the plurality of supply ports 191 are formed at intervals along the circumferential direction of the side wall 101s of the chamber 101, and that a groove 101g is formed corresponding to each of the plurality of supply ports 191. Therefore, because the ionic liquid flows over a wide range of inner wall of the chamber 101, the surface area of the ionic liquid flowing in the chamber 101 becomes large. As a result, the absorption efficiency of the oxidizing gas remaining in the chamber 101 is increased.

Third Embodiment

Figure 3:
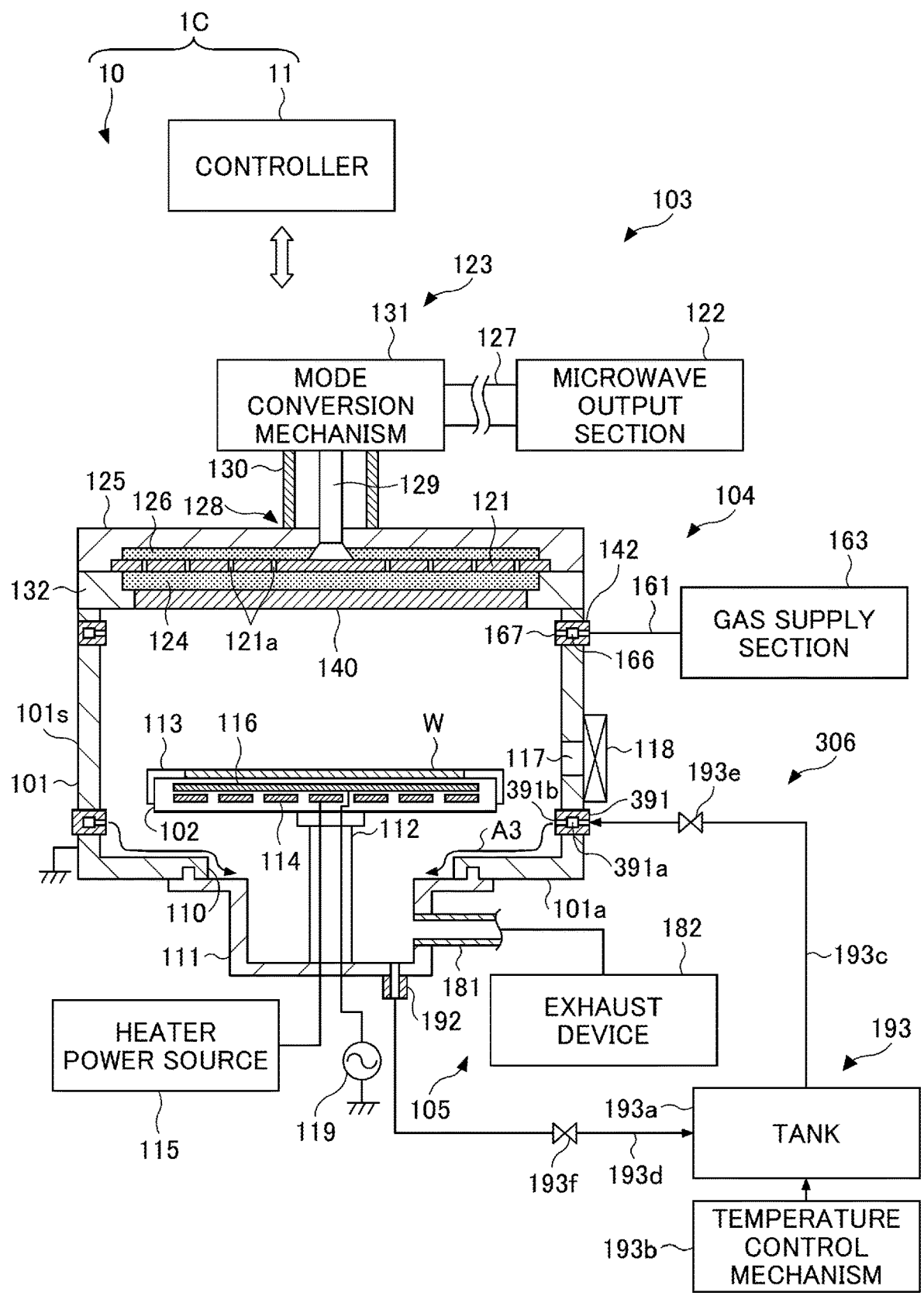
FIG. 3 is a schematic diagram illustrating an example of a vacuum processing apparatus according to a third embodiment.

Referring to FIG. 3, an example of a vacuum processing apparatus 1C according to a third embodiment will be described. The vacuum processing apparatus 1C according to the third embodiment differs from the vacuum processing apparatus 1A of the first embodiment in including a liquid supply mechanism 306 including a supply port 391 provided annularly along the inner wall of the chamber 101 instead of the supply port 191. Hereinafter, different points from the vacuum processing apparatus 1A will be mainly described.

The liquid supply mechanism 306 supplies an ionic liquid into the chamber 101 and collects the ionic liquid supplied into the chamber 101. The ionic liquid is an ionic liquid that absorbs an oxidizing gas. The liquid supply mechanism 306 includes the supply port 391, the discharge port 192, the liquid circulating section 193, and the like.

The supply port 391 is provided annularly along the inner wall of the chamber 101. The supply port 391 includes an annular liquid flow path 391a provided inside and a plurality of liquid ejection ports 391b connected to and opened inside the liquid flow path 391a. The tank 193a is connected to the liquid flow path 391a through the forward pipe 193c. While flowing in the circumferential direction of the chamber 101 along the liquid flow path 391a, the ionic liquid introduced to the supply port 391 is supplied from the plurality of liquid ejection ports 391b into the chamber 101 as indicated by the arrow A3 in FIG. 3 and flows downward along the inner wall of the chamber 101. Therefore, because the ionic liquid flows over a wide range of inner wall of the chamber 101, the surface area of the ionic liquid flowing in the chamber 101 becomes large. As a result, the absorption efficiency of the oxidizing gas remaining in the chamber 101 is increased.

As described above, the vacuum processing apparatus 1C according to the third embodiment includes the supply port 391 formed on the side wall 101s of the chamber 101 to supply the ionic liquid into the chamber 101 and the discharge port 192 for discharging the ionic liquid supplied in the chamber 101. This allows the ionic liquid to be supplied from the supply port 391 into the chamber 101 to absorb the oxidizing gas remaining in the chamber 101 by the ionic liquid. In addition, the ionic liquid absorbing the oxidizing gas can be discharged from the discharge port 192 to the outside of the chamber 101. As a result, the oxidizing gas remaining in the chamber 101 can be removed.

Also, according to the vacuum processing apparatus 1C of the third embodiment, the supply port 391 includes the annular liquid flow path 391a provided inside and the plurality of liquid ejection ports 391b connected to and opened inside the liquid flow path 391a. As a result, the ionic liquid can be ejected from the plurality of positions in the circumferential direction of the chamber 101. Therefore, the ionic liquid flows over a wide range of inner wall of the chamber 101, and the surface area of the ionic liquid flowing in the chamber 101 becomes large. As a result, the absorption efficiency of the oxidizing gas remaining in the chamber 101 is increased.

It should be noted that although, in the third embodiment described above, the vacuum processing apparatus 1C includes the liquid supply mechanism 306 including the supply port 391 provided in an annular shape along the inner wall of the chamber 101 in lieu of the supply port 191 included in the vacuum processing apparatus 1A, the present disclosure is not limited to this. For example, the vacuum processing apparatus 1C may include both a supply port 191 and a supply port 391.

Fourth Embodiment

Figure 4:
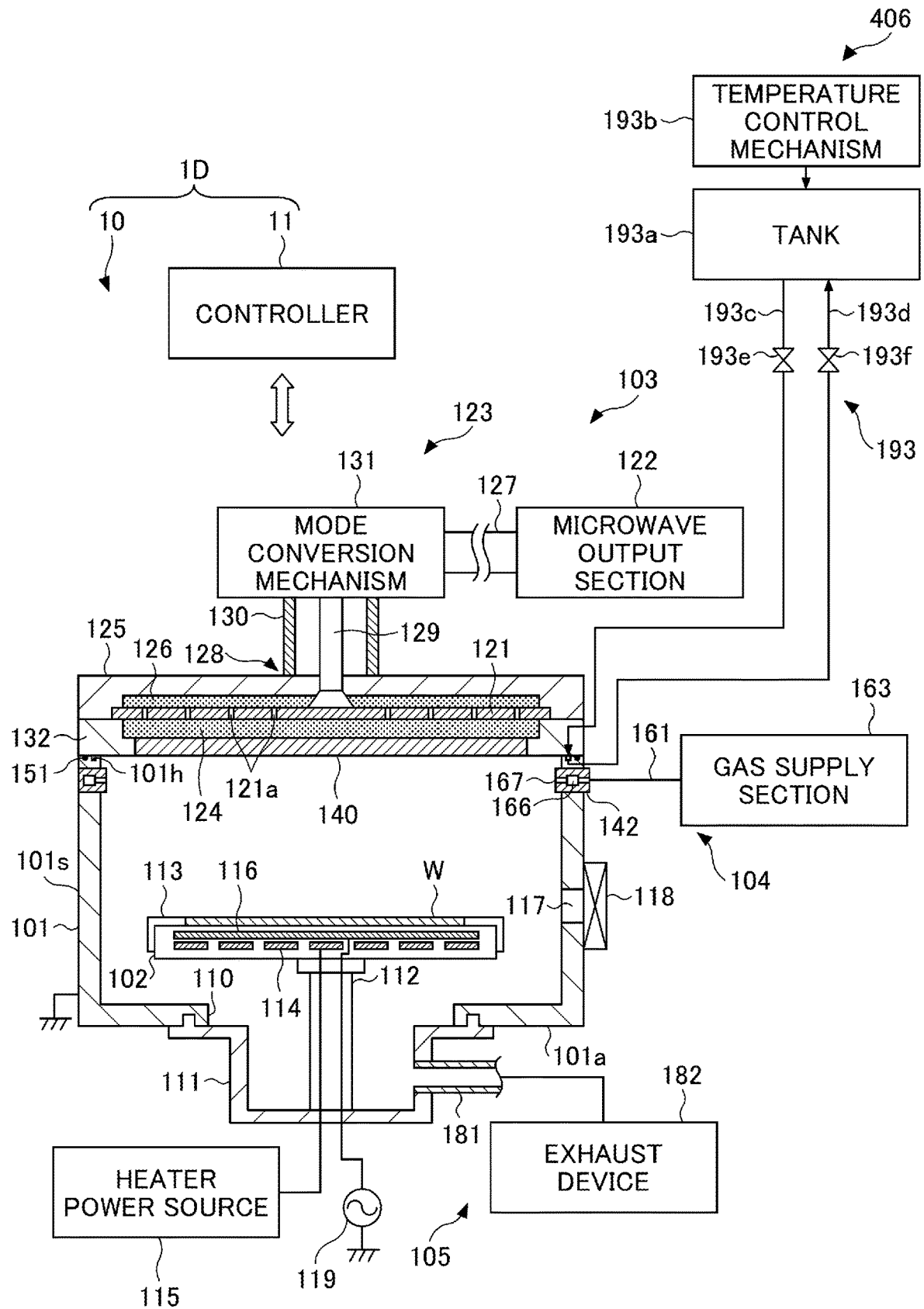
FIG. 4 is a schematic diagram illustrating an example of a vacuum processing apparatus according to a fourth embodiment.

An example of a vacuum processing apparatus 1D according to a fourth embodiment will be described with reference to FIG. 4 and FIG. 5. The vacuum processing apparatus 1D according to the fourth embodiment differs from the vacuum processing apparatus 1A according to the first embodiment in that a recess 101h for flowing an ionic liquid is formed at a joint portion between the members constituting the process container. Hereinafter, different points from the vacuum processing apparatus 1A will be mainly described.

A sealing material 151 is provided at the joint portion of the chamber 101 and a support member 132 to seal the joint portion. The sealing material 151 may be, for example, an O-ring.

The recess 101h is annularly formed along the sealing material 151 on the vacuum side of the sealing material 151 at the joint portion of the chamber 101 and the support member 132. The recess 101h is in communication with the supply port 491, and the ionic liquid is supplied to the recess 101h through the supply port 491. The ionic liquid supplied to the recess 101h flows along the circumferential direction of the chamber 101 along the recess 101h.

The recess 101h is preferably formed so that the ionic liquid flowing through the recess 101h contacts both the chamber 101 and the support member 132. This allows the ionic liquid flowing through the recess 101h to function as an annular conductive sealing material represented by a spiral seal. That is, the ionic liquid flowing through the recess 101h ensures continuity between the chamber 101 and the support member 132 and keeps the support member 132 at the ground potential. The ionic liquid flowing through the recess 101h also prevents the leakage of high frequency or plasma from between the chamber 101 and the support member 132. It should be noted that in a case in which the ionic liquid flowing in the recess 101h is used instead of a spiral seal, the ionic liquid flowing in the recess 101h is recovered by opening the valve 193f when the chamber 101 is opened to atmosphere by maintenance or the like. Further, when the maintenance or the like is completed and the inside of the chamber 101 is depressurized, the valve 193f is closed and the valve 193e is opened to fill the recess 101h with the ionic liquid and then the inside of the chamber 101 is depressurized. Thus, since the ionic liquid filled in the recess 101h absorbs the oxidizing gas within the chamber 101, the chamber 101 can be allowed to be in a high vacuum and an environment with less oxidizing gas can be formed.

Figure 5:
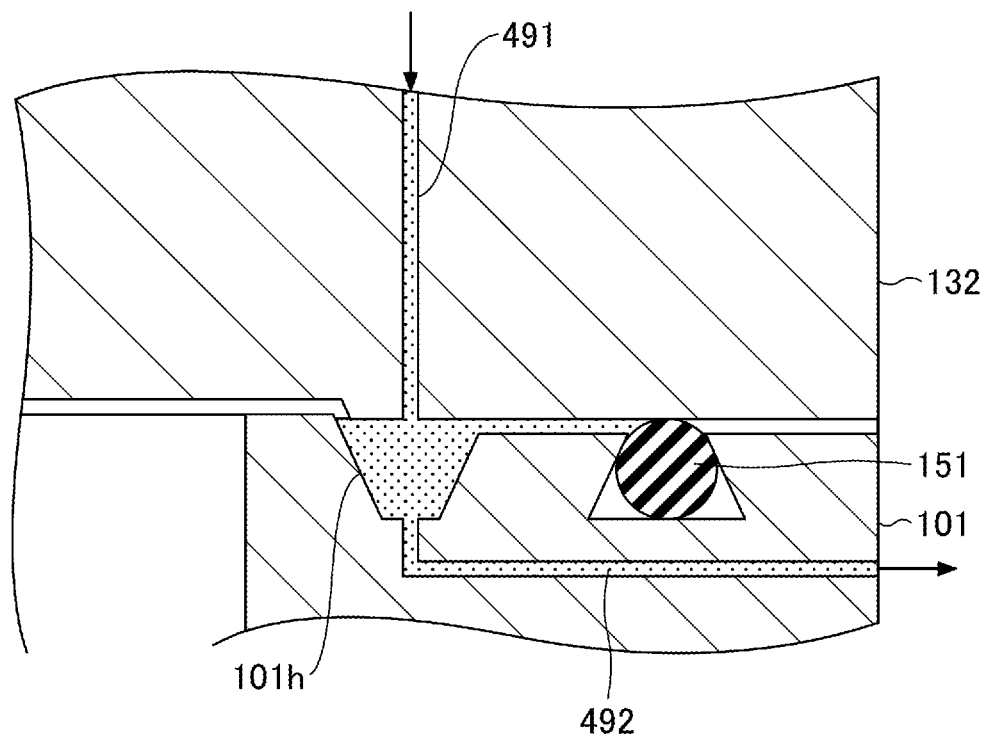
FIG. 5 is an enlarged view of a joint portion between a process container and a support member in the vacuum processing apparatus of FIG. 4.

The recess 101h has a depth on the vacuum side deeper than the depth on the sealing material 151 side, as illustrated in FIG. 5. Thus, the ionic liquid filled in the recess 101h is suppressed from flowing out to the vacuum side, and therefore the state in which the recess 101h is filled with the ionic liquid can be maintained.

The supply port 491 is formed so as to penetrate the support member 132. The supply port 491 is in communication with the recess 101h and supplies the ionic liquid from the side of the process container to the recess 101h in the process container.

The discharge port 492 is formed to penetrate the side wall 101s of the chamber 101 and is in communication with the recess 101h. The discharge port 492 discharges the ionic liquid flowing through the recess 101h to the outside of the chamber 101.

As described above, the vacuum processing apparatus 1D according to the fourth embodiment includes the supply port 491 formed on the side wall (support member 132) of the process container to supply the ionic liquid to the recess 101h and the discharge port 492 that discharges the ionic liquid supplied to the recess 101h. This allows the ionic liquid to be supplied from the supply port 491 to the recess 101h to absorb the oxidizing gas remaining in the chamber 101 by the ionic liquid. In addition, the ionic liquid absorbing the oxidizing gas can be discharged from the discharge port 492 to the chamber 101. As a result, the oxidizing gas remaining in the chamber 101 can be removed.

In addition, according to the vacuum processing apparatus 1D of the fourth embodiment, the ionic liquid flowing through the recess 101h contacts both the chamber 101 and the support member 132. This allows the ionic liquid flowing through the recess 101h to function as an annular conductive sealing material instead of a spiral seal. That is, the ionic liquid flowing through the recess 101h ensures continuity between the chamber 101 and the support member 132 and keeps the support member 132 at the ground potential. The ionic liquid flowing through the recess 101h also prevents the leakage of high frequency or plasma from between the chamber 101 and the support member 132.

It should be noted that although the depth on the vacuum side is deeper than the depth on the sealing material 151 side of the recess 101h in the described fourth embodiment, the present disclosure is not limited thereto. For example, the depth of the vacuum side and the depth of the sealing material 151 side of the recess 101h may be the same. In this case, a portion of the ionic liquid flowing through the recess 101h flows into the inner wall of the chamber 101, thereby increasing the surface area of the ionic liquid flowing through the chamber 101. As a result, the absorption efficiency of the oxidizing gas remaining in the chamber 101 is increased. In this case, in addition to the discharge port 492 communicating with the recess 101h, by providing a discharge port formed to penetrate the bottom of the exhaust chamber 111, the ionic liquid flowing into the inner wall of the chamber 101 can be discharged to the outside of the chamber 101.

Although, in the fourth embodiment described above, the vacuum processing apparatus 1D includes the liquid supply mechanism 406 including the supply port 491 formed to penetrate the support member 132 instead of the supply port 191 included in the vacuum processing apparatus 1A, the present disclosure is not limited to this. For example, the vacuum processing apparatus 1D may include both the supply port 191 and the supply port 491. For example, the vacuum processing apparatus 1D may include the groove 101g included in the vacuum processing apparatus 1B and may include the supply port 391 included in the vacuum processing apparatus 1C.

Ionic Liquid

In the vacuum processing apparatuses 1A to 1D, an example of a suitably available ionic liquid will be described. The ionic liquid is an ionic liquid that absorbs an oxidizing gas. Examples of the oxidizing gas include $H_2O$ gas and $O_2$ gas.

In a case in which the oxidizing gas to be absorbed by the ionic liquid is $H_2O$ gas, the ionic liquid having a molecular structure with a high polarity can be suitably used as the ionic liquid. By using the ionic liquid having a molecular structure with a high polarity, the ionic liquid can efficiently absorb $H_2O$, which is a polar molecule. Examples of such an ionic liquid include DEME-$BF_4$ (N,N-Diethyl-N-methyl-N-(2-methoxyethyl)ammonium tetrafluoroborate) and EMI- AcO (1-Ethyl-3-methylimidazolium-acetate). Also, it may be a halide-based ionic liquid such as [BPy]Cl represented by chemical formula I1, [B2MPY]Cl represented by chemical formula I2, [B3MPy]Cl represented by chemical formula I3, and [B4MPY]Cl represented by chemical formula I4.

Chemical Formulas 1

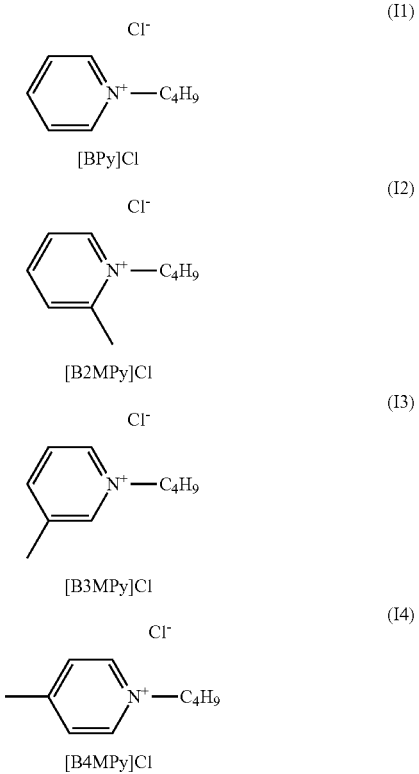

In a case in which the oxidizing gas to be absorbed by the ionic liquid is $H_2O$ gas and $O_2$ gas, the ionic liquid having a molecular structure including a non-polar portion can be preferably used as the ionic liquid, for example. In general, because many ionic liquids, which are combinations of anions and cations, have polarity, it is considered that nonpolar $O_2$ molecules are not easily absorbed by an ionic liquid with polarity. Therefore, by using ionic liquid having a molecular structure including a non-polar portion, $O_2$ gas can be absorbed efficiently by the nonpolar portion contained in the ionic liquid. Such an ionic liquid may be MEMP (N-(2-methoxyethyl)-N-methyl-pyrrolidinium)-TFSI (bis(tri-fluoro-methane-sulfonyl)imide).

The embodiments disclosed herein should be considered exemplary in all respects and are not limited thereto. The embodiments as described above may be, omitted, substituted, and changed in various forms without departing from the appended claims and spirit thereof.

In the above embodiments, although a case has been described in which a liquid circulating section for introducing and circulating an ionic liquid discharged from a discharge port to a supply port, the present disclosure is not limited thereto. For example, an ionic liquid may be introduced from an ionic liquid supply source into a supply port without providing a liquid circulation section.

In the embodiments described above, the vacuum processing apparatus is configured as a cold wall type apparatus, but the present disclosure is not limited thereto. The ionic liquid does not volatilize even in vacuum and has heat resistance. Thus, the vacuum processing apparatus may be a hot wall type apparatus in which the wall surface of the process container is heated to a high temperature.

In the embodiments described above, the vacuum processing apparatus is configured as a plasma processing apparatus, but the present disclosure is not limited thereto. The vacuum processing apparatus is not limited to a plasma processing apparatus as long as it is an apparatus that applies a predetermined process (e.g., deposition, etching) to a substrate. For example, the vacuum processing apparatus may be an ALD (Atomic Layer Deposition) apparatus, a CVD (Chemical Vapor Deposition) apparatus, a PVD (Physical Vapor Deposition) apparatus, or the like.

What is claimed is:

1. A vacuum processing apparatus comprising:
   a decompressable process container;
   the process container including a support member and a side wall of the process container, wherein the support member is provided on the side wall of the process container and is configured to support a dielectric window;
   a tank storing an ionic liquid that absorbs an oxidizing gas;
   a supply port connected to the tank and configured to supply the ionic liquid from the tank to the process container; and
   a discharge port configured to discharge the ionic liquid supplied to the process container,
   wherein a recess is annularly provided at a joint portion between the support member and the side wall of the process container,
   wherein the supply port is configured to supply the ionic liquid to the recess, and the discharge port is configured to discharge the ionic liquid supplied to the recess,
   wherein the vacuum processing apparatus further comprises a sealing material configured to seal the joint portion from an outside of the process container,
   wherein the recess is provided on a vacuum side of the sealing material at the joint portion and that is in communication with the supply port and an inside of the process container, and the ionic liquid supplied from the supply port flows through the recess along the sealing material,
   wherein the discharge port is provided in communication with the recess, the discharge port being located at a bottom of the recess,
   wherein a top surface of an inner annular rim of the side wall of the process container is higher than a bottom surface of the support member, and
   wherein the ionic liquid flowing through the recess is in contact with the sealing material and the bottom surface of the support member, but not the top surface of the inner annular rim of the side wall of the process container.

2. The vacuum processing apparatus according to claim 1, wherein the ionic liquid is MEMP (N-(2-methoxyethyl)-N-methyl-pyrrolidinium)-TFSI(bis(tri-fluoro-methane-sulfonyl)imide).

3. A method for removing an oxidizing gas in a vacuum processing apparatus including:
   a decompressable process container;
   the process container including a support member and a side wall of the process container, wherein the support member is provided on the side wall of the process container and is configured to support a dielectric window;
a tank storing an ionic liquid that absorbs an oxidizing gas;
a supply port connected to the tank and configured to supply the ionic liquid from the tank to the process container; and
a discharge port configured to discharge the ionic liquid supplied to the process container,
wherein a recess is annularly provided at a joint portion between the support member and the side wall of the process container,
wherein the supply port is configured to supply the ionic liquid to the recess, and the discharge port is configured to discharge the ionic liquid supplied to the recess,
wherein the vacuum processing apparatus further comprises a sealing material configured to seal the joint portion from an outside of the process container,
wherein the recess is provided on a vacuum side of the sealing material at the joint portion and that is in communication with the supply port and an inside of the process container, and the ionic liquid supplied from the supply port flows through the recess along the sealing material,
wherein the discharge port is provided in communication with the recess, the discharge port being located at a bottom of the recess,
wherein a top surface of an inner annular rim of the side wall of the process container is higher than a bottom surface of the support member, and
wherein the ionic liquid flowing through the recess is in contact with the sealing material and the bottom surface of the support member, but not the top surface of the inner annular rim of the side wall of the process container, the method comprising:
supplying the ionic liquid that absorbs the oxidizing gas to the recess from the supply port, thereby absorbing the oxidizing gas remaining in the process container by the ionic liquid; and
discharging the ionic liquid supplied to the recess.

* * * * *